US006235558B1

United States Patent
Oda et al.

(10) Patent No.: US 6,235,558 B1
(45) Date of Patent: May 22, 2001

(54) METHOD FOR FABRICATING SEMICONDUCTOR DEVICE

(75) Inventors: Akihiro Oda, Tenri; Sumio Kato, Ikoma-gun; Hiroyuki Ogawa, Yamatokooriyama, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/540,218

(22) Filed: Mar. 31, 2000

(30) Foreign Application Priority Data

Apr. 2, 1999 (JP) .................................................. 11-095613

(51) Int. Cl.$^7$ .................................................. H01L 21/335
(52) U.S. Cl. ........................ 438/142; 438/234; 438/236; 438/453; 438/669
(58) Field of Search ................................. 438/142, 234, 438/236, 453, 669

(56) References Cited

U.S. PATENT DOCUMENTS

| 4,914,500 | * | 4/1990 | Liu et al. ................................ 357/67 |
| 5,472,887 | * | 12/1995 | Hutter et al. ............................ 437/34 |
| 5,476,803 | * | 12/1995 | Liu ......................................... 437/44 |
| 6,004,840 | * | 12/1999 | Kimura et al. ........................ 438/234 |
| 6,025,241 | * | 2/2000 | Lin et al. ............................... 438/303 |

FOREIGN PATENT DOCUMENTS

| 6-13407 | 1/1994 | (JP) . |
| 6-260646 | 9/1994 | (JP) . |
| 8-153875 | 6/1996 | (JP) . |
| 8-222736 | 8/1996 | (JP) . |
| 9-45930 | 2/1997 | (JP) . |

* cited by examiner

Primary Examiner—Richard Elms
Assistant Examiner—Pho Luu
(74) Attorney, Agent, or Firm—Nixon & Vanderhye P.C.

(57) ABSTRACT

There is provided a method for stably fabricating a TFT having a GOLD structure capable of ensuring sufficiently high ON-state current and sufficiently low OFF-state current at the same time and superior in hot carrier resistance. The method includes forming a semiconductor layer of a specified configuration and then forming a gate insulator film on the semiconductor layer, forming a lightly doped region by doping the semiconductor layer with dopants at low concentration by using as a mask a dopant blocking film formed on the gate insulator film. The method further includes forming a gate electrode having a length reaching the lightly doped region after removing the dopant blocking film, forming an anodic oxide layer on each side face of the gate electrode by anodically oxidizing the gate electrode, forming a heavily doped region by doping the semiconductor layer with dopants by using as a mask the gate electrode and the anodic oxide layer, and removing the anodic oxide layer.

4 Claims, 6 Drawing Sheets

METHOD FOR FABRICATING SEMICONDUCTOR DEVICE

BACKGROUND OF THE INVENTION

The present invention relates to a method for fabricating MOS (Metal Oxide Semiconductor) semiconductor devices such as insulated-gate transistors to be formed on an insulating material or silicon wafer or the like. In particular, the invention relates to a semiconductor device fabrication method applicable to thin film transistors to be formed on a-glass substrate having a glass transition point of 750° C. or lower.

Conventionally, MOS semiconductor devices have been used for various kinds of electronic devices or the like, a typical example thereof being MOS transistors (also called MOSFET, insulated gate transistors, etc.). Among electronic devices, in particular, thin film transistors (hereinafter, referred to as TFT) widely used as semiconductor devices for driving active matrix type liquid crystal displays, image sensors and the like can be included in the MOS semiconductor devices, in the wide sense, because of their being partly similar in structure to the MOS transistors.

Particularly in recent years, in keeping up with increasing demands for scaling down and higher speed of semiconductor devices, polysilicon TFTs using polysilicon thin film having a higher electron field-effect mobility have been developed instead of amorphous silicon TFTs using amorphous silicon thin film as the active layer.

However, it is pointed out as a drawback that, in general, using the polysilicon thin film as the active layer of a MOS transistor would result in lower breakdown voltage of drain junction as well as increased junction leak current (hereinafter, referred to as OFF-state current). It is also known that forming an off-set gate structure or LDD (Lightly Doped Drain) structure is effective for breakdown voltage enhancement and OFF-state current reduction of MOS transistors.

The off-set gate structure is a structure in which an end portion of the gate electrode is shifted toward the channel region rather than the boundary portion between the channel region and the source/drain region, which is a heavily doped region so that a non-doped region with no dopants introduced thereto is provided between the end portion of the gate electrode and the source/drain region.

The LDD structure is a structure in which a lightly doped region of the same conductive type as the source/drain region is formed in at least one boundary portion between the channel region and the source/drain region that is a highly doped region. This lightly doped region is called LDD region. One example of the LDD structure in shown in FIG. 7.

Hitherto, such LDD structure as described above has been widely used for many MOS semiconductor devices including MOS transistors. Forming the LDD region or non-doped region causes a gentle dopant level profile to be formed between the channel region and the source/drain region, while separation of the gate electrode end and the source/drain region end from each other causes the OFF-state current to be reduced and the electric field in proximity to the source/drain region to be relaxed.

Nonetheless, as transistors go progressively smaller-sized with the LDD region resultantly smaller, the field relaxation effect reduces. As a result, a phenomenon has been pointed out as an issue that a high electric field is generated near the drain region and hot carriers thereby generated are trapped into the gate insulator on the LDD region, resulting in considerable fluctuations or reductions in device characteristics such as threshold voltage.

Thus, for improvement in the resistance to hot carriers, recent years' attention have been directed to the gate overlapped structure (hereinafter, referred to as GOLD structure) in which the gate electrode is overlapped with the LDD region via the gate insulator.

As to GOLD structures, various kinds of fabrication methods are conventionally proposed in, for example, Japanese Patent Laid-Open Publications HEI 6-13407, HEI 6-260646, HEI 8-153875, HEI 8-222736, HEI 9-45930 and the like.

First, Japanese Patent Laid-Open Publication HEI 9-45930 discloses a method for fabricating a GOLD structure by using a dopant blocking film made of photoresist. Japanese Patent Laid-Open Publication HEI 8-153875 discloses a method for fabricating a GOLD structure by using a conductive coating made primarily of silicon and formed on a side face of the gate electrode. Further, Japanese Patent Laid-Open Publications HEI 6-13407, HEI 6-260646 and HEI 8-222736 disclose methods for fabricating a GOLD structure by providing a second gate electrode which is made of conductive film and which connects with the gate electrode or covers the surface of the gate electrode.

As described above, the conventional LDD structures on one hand have remarkable effects for higher breakdown voltage and lowered OFF-state current of TFTs, and on the other hand have a problem that drive current (hereinafter, referred to as ON-state current) of TFTs lowers. In the conventional LDD structures, the LDD region is located outside the gate electrode. On this account, the LDD region is not subject to modulation by the gate voltage, causing the ON-state current to lower correspondingly. Particularly with the LDD region provided on the source region side, the ON-state current would lower to a large extent.

Meanwhile, according to the GOLD structure in which the gate electrode is overlapped with part of the LDD region via the gate insulator, since the LDD region is also modulated by the gate voltage, the OFF-state current can be reduced without lowering the ON-state current. Besides, deteriorations of device characteristics caused by hot carriers being trapped into the gate insulator, which have come up as an issue of the conventional LDD structures, can be prevented at the same time.

However, among the conventional fabrication methods for the GOLD structures as described above, in the fabrication method shown in Japanese Patent Laid-Open Publication HEI 9-45930, both the step of forming a lightly doped region which is the LDD region and the step of forming a heavily doped region which is the source and drain regions are implemented by using a dopant blocking film made of photoresist or the like. On this account, neither the lightly doped region nor the heavily doped region is formed in self alignment relative to the gate electrode, so that the positional alignment of these regions may be impaired. Further, the number of photolithography steps for forming the lightly doped region and the heavily doped region is increased by the exposure and development of the dopant blocking film and the like, making the fabrication method complex, which leads to an anxiety for effects on the conforming article rate and characteristic uniformity of TFTs.

In the fabrication method shown in Japanese Patent Laid-Open Publication HEI 8-153875, a side wall by conductive coating composed primarily of silicon is formed on the side face of the gate electrode.

Then the lightly doped region is formed in self alignment to the gate electrode, while the heavily doped region is formed in self alignment to the side wall. On this account, the level of overlap of the side wall with the lightly doped region cannot be set arbitrarily. Also, there arise needs for a film deposition step and an etchback step for forming the side wall. Because the setting and control of etching conditions for the etchback step is not easy, it can be foreseen that control of the width of the LDD region by arbitrarily setting the width of the side wall encounters difficulty.

Further, in the fabrication method shown in Japanese Patent Laid-Open Publication HEI 6-13407, a second gate electrode which connects with a first gate electrode is overlapped with the LDD region. In the fabrication method shown in Japanese Patent Laid-Open Publication HEI 6-260646, a second gate electrode is formed so as to cover the first gate electrode. In the fabrication method shown in Japanese Patent Laid-Open Publication HEI 8-22736, a second gate electrode which covers a first gate electrode is formed by selective CVD process. In these methods, the gate electrode becomes complex in structure, posing problems such as increases in step number and difficulties in setting and controlling film deposition conditions for forming the second gate electrode.

As shown above, according to the conventional fabrication methods for GOLD structure, it could be said that there are a number of problems, in all cases, such as increases in step number and involvement of some steps that could be hard to control, from the viewpoint of practical use, in particular, implementation of mass production.

SUMMARY OF THE INVENTION

The present invention having been achieved to solve these and other problems, an object of the invention is therefore to provide a method for stably fabricating a semiconductor device having a GOLD structure capable of ensuring sufficiently high ON-state current and sufficiently low OFF-state current at the same time and superior in hot carrier resistance.

In order to achieve the object, according to the present invention, there is provided a method for fabricating a semiconductor device having a source region, a drain region, a channel region, a gate insulator film and a gate electrode, the method comprising the steps of:

forming a gate insulator film on a surface of a semiconductor;

forming a dopant blocking film of a specified configuration on the gate insulator film;

forming a lightly doped region by doping the semiconductor with dopants at low concentration by using the dopant blocking film as a mask;

forming an electrically conductive material layer on the gate insulator film after removing the dopant blocking film;

forming a gate electrode by processing the conductive material layer into a configuration longer than the dopant blocking film;

forming an oxide layer primarily on each side face of the gate electrode by oxidizing the gate electrode;

forming a heavily doped region by doping the semiconductor with dopants at high concentration by using the gate electrode and the oxide layer as a mask; and removing the oxide layer.

According to the method for fabricating a semiconductor device according to the present invention, after the steps of forming a dopant blocking film on the gate insulator film and doping the semiconductor with dopants at low concentration, the dopant blocking film is removed and the electrically conductive material layer to make the gate electrode is deposited so as to form a pattern longer than the dopant blocking film, more specifically, a pattern having a length resulting from summing up a length of the channel region, a necessary length of the lightly doped region and a deviation i.e., shift amount involved in positional alignment. Thus, by forming a pattern with considerations given to a positional deviation involved in the photolithography process, a structure in which the gate electrode is overlapped with the lightly doped region can be obtained securely and relatively easily even if more or less positional deviations occur in the photolithography process.

Also, such a structure in which the gate electrode is overlapped with the lightly doped region has a structural advantage that the ON-state current is less reduced by the presence of the LDD region, compared with the conventional LDD structures. Therefore, even if a lightly doped region is more or less elongated, it would not affect the characteristics. Instead, the lightly doped region can be made longer than that of conventional LDD structures, so that the OFF-state current can be further suppressed.

Further, according to the method for fabricating a semiconductor device of the present invention, after the gate electrode is formed by patterning the conductive material layer, the oxide layer is formed primarily on the side face of the gate electrode, and with those films used as a mask, a high-concentration doping is done. Therefore, positions of the lightly doped region and the heavily doped region can be determined in self alignment.

According to the method for fabricating a semiconductor device of the present invention, by controlling the thickness of the oxide layer formed primarily on the side face of the gate electrode, the length of the lightly doped region can be set arbitrarily. Therefore, the OFF-state current can be suppressed to a necessary extent.

According to the method for fabricating a semiconductor device of the present invention, the number of times of alignment involved in the photolithography process can be lessened, as compared with the conventional methods for fabricating semiconductor devices having a conventional GOLD structure. Therefore, the rate of conforming articles and characteristic uniformity of the resulting semiconductor devices can be stabilized and improved.

Also, according to the method for fabricating a semiconductor device of the present invention, since the resulting semiconductor device has a GOLD structure, device deteriorations due to negative charges generated in the interface between silicon and oxide on the LDD region or in the oxide in its proximity, as would be seen in the conventional LDD structures, are unlikely to develop by intercepting it by the electrons induced to the LDD region surface by the gate voltage, thus unlikely to develop. Thus, it becomes implementable to remarkably improve the resistance to hot carriers.

In one embodiment, the step for forming the oxide layer on the side face of the gate electrode is an anodic oxidation process performed by applying a current to the gate electrode in an electrolytic solution, and the oxide layer is an anodic oxide layer.

In one embodiment, a boundary position between the gate electrode and the oxide layer is set to an arbitrary position on the lightly doped region.

According to the method for fabricating a semiconductor device, the oxide layer to be formed primarily on the side face of the gate electrode can be formed by anodic oxidation process in which a current is applied to the gate electrode in an electrolytic solution. Therefore, the thickness of the oxide layer can be easily controlled, and the oxide layer can be formed with simple equipment.

One embodiment further comprises a step for, after the step of forming an oxide layer on the side face of the gate electrode, forming a barrier type anodic oxide layer between the gate electrode and the oxide layer by anodically oxidizing the gate electrode.

According to the above embodiment, the gate electrode is protected by the barrier type anodic oxide layer, because the barrier type anodic oxide layer is substantially not etched even if the oxide layer is etched.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, preferred embodiments according to the semiconductor device of the present invention are described in detail with reference to the accompanying drawings. In these embodiments, the semiconductor device is exemplified by a polysilicon TFT to be fabricated on a glass substrate or the like.

Embodiment 1

FIGS. 1A, 1B, 2A, 2B, 3A, 4A and 4B to 4 are schematic sectional views showing fabrication processes for a polysilicon TFT, which is a semiconductor device of this embodiment. FIG. 5 is a schematic sectional view showing the construction of the polysilicon TFT of this embodiment.

First, as shown in FIG. 5, according to the polysilicon TFT of this embodiment, a gate electrode 7 is formed so as to overlap part of a lightly doped region 5. As a result of this, deteriorations of device characteristics due to hot carriers caused by the generation of high electric fields are suppressed.

Now the fabrication process of the polysilicon TFT of this embodiment is described in detail with reference to the drawings.

Figure 1A:
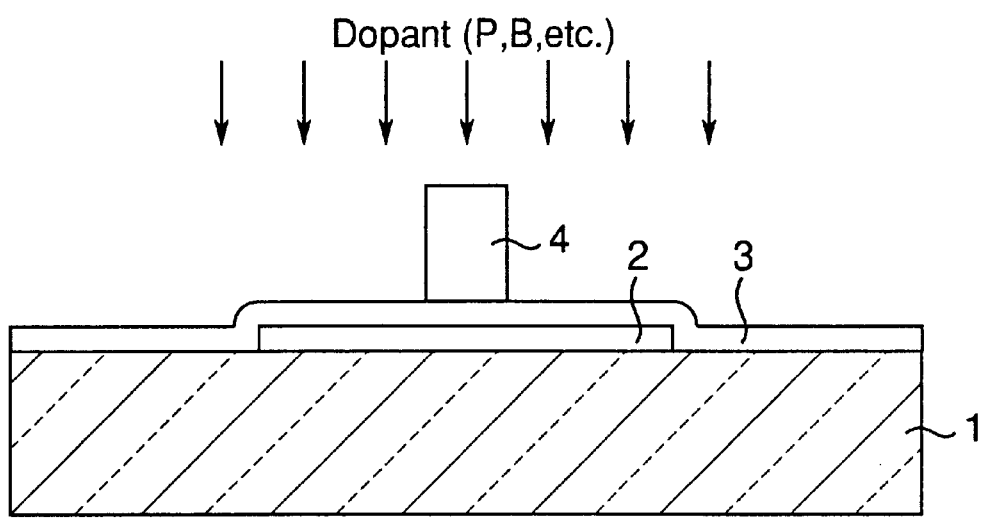
FIGS. 1A and 1B are process views showing a method for fabricating a semiconductor device according to the invention.

First, as shown in FIG. 1A, on a substrate 1 made of glass or quartz or the like, was deposited an amorphous silicon film to 10 nm–500 nm, preferably 20 nm–100 nm, by plasma CVD (Chemical Vapor Deposition) process, LP (Low Pressure) CVD process, sputtering process or the like. Then the amorphous silicon film was subject to a 24-hour heat treatment at temperatures of 550° C.–600° C., by which a polysilicon film was formed. In addition, a base film formed of silicon oxide or the like may preparatorily be formed prior to depositing the amorphous silicon thin film. This step for forming the polysilicon film may also be done by irradiation of an excimer laser to the deposited amorphous silicon thin film.

The polysilicon film formed in this way was patterned into a specified configuration, for example, an island shape, by which a semiconductor layer 2 for the TFT was formed.

Subsequently, 70 nm–150 nm thick silicon oxide was deposited on the substrate 1 and the semiconductor layer 2 by plasma CVD process, by which a gate insulator film 3 was formed. Thereafter, a dopant blocking film 4 of a specified length was formed so that a required TFT channel region could be ensured. More specifically, the dopant blocking film 4 was formed by patterning photoresist to a specified length.

Subsequently, with this dopant blocking film 4 used as a mask, the semiconductor layer 2 was doped with a dopant at low concentration. More specifically, the semiconductor layer 2 was doped with ions of a dopant such as phosphorus (P) for n-type TFT and boron (B) for p-type TFT by electric field acceleration.

Figure 1B:
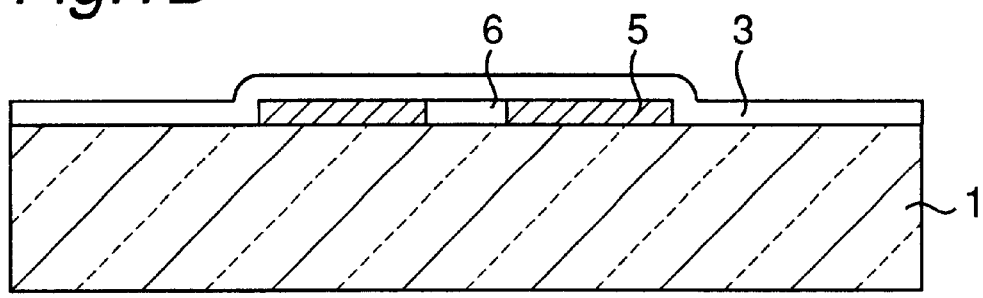

Next, as shown in FIG. 1B, the used dopant blocking film 4 was removed. Thereafter, to activate the dopant, a 12-hour heat treatment was carried out at temperatures of 550° C.–600° C. As a result, a lightly doped region 5 was formed, and a region which was masked by the dopant blocking film 4 and not doped with the dopant became a channel region 6. In addition, this activation step may also be done by laser irradiation. In this case, since the channel region 6 is also exposed to the laser irradiation, laser energy is preferably set to such a level that the polysilicon film is not melted.

Figure 2A:
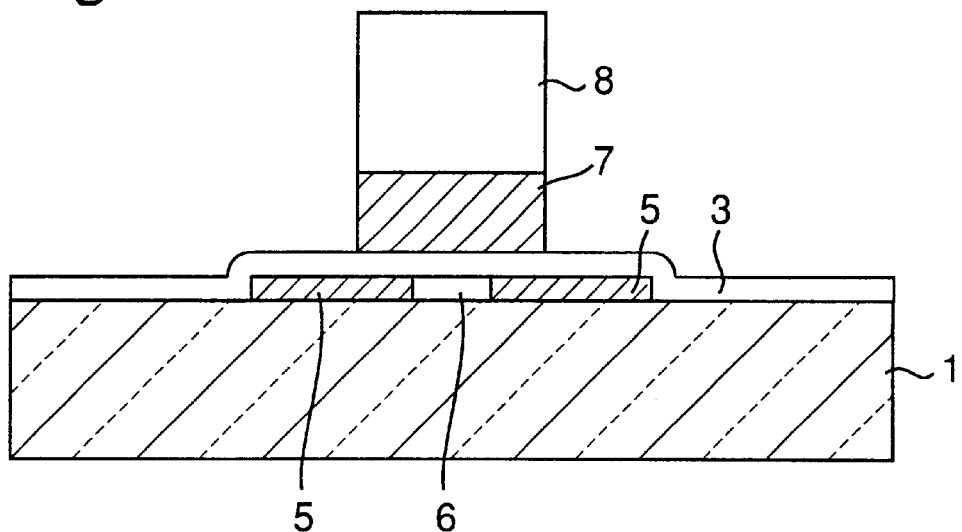
FIGS. 2A and 2B are process views showing a method for fabricating a semiconductor device according to the invention.

Next, as shown in FIG. 2A, coating formed from a material capable of anodic oxidation was deposited on the gate insulator 3, and patterned into a specified configuration, by which a gate electrode 7 was formed. As the material of this coating, aluminum, tantalum, titanium and silicon or their alloys capable of anodic oxidation are preferable. In this embodiment, a metal film formed from an aluminum alloy composed primarily of aluminum was deposited by sputtering process. Then, by photolithography and etching, the metal film was patterned so as to be longer than the dopant blocking film 4 used in FIG. 1A, by which the gate electrode 7 was formed.

More specifically, the length of the gate electrode 7 is preparatorily designed to a length resulting from summing up a length of the channel region 6, a necessary length of the lightly doped region 5 and a deviation amount involved in positional alignment. By so designing, the finally resulting gate electrode 7 can be at least overlapped with the lightly doped region 5 formed in FIG. 1A.

In such a GOLD structure, since reduction of the ON-state current can be suppressed structurally, the length of the lightly doped region 5 can be set even longer. Accordingly, for positional alignment of the gate electrode 7 relative to the channel region 6 and the lightly doped region 5, a pattern having a length determined by preparatorily taking into consideration more or less positional deviations can be used.

Therefore, according to the fabrication method of this invention, the finally resulting gate electrode 7 never deviates from the channel region 6 and the lightly doped region 5.

Figure 2B:
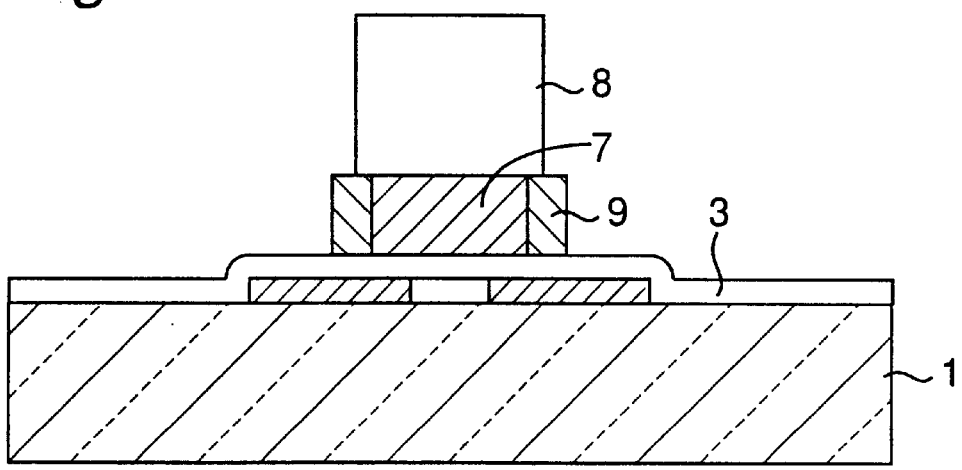

Next, as shown in FIG. 2B, with a mask film 8 provided on the gate electrode 7, a current was applied to the gate electrode 7 in an electrolytic solution, by which a porous anodic oxide layer 9 was formed on the side face of the gate electrode 7. This anodic oxidation step is performed by using a 1%–20% acidic aqueous solution of citric acid or such acids as oxalic acid, phosphoric acid, chromic acid and sulfuric acid, where a low voltage of about 1 V–30 V is only required to form an anodic oxide layer 9 as thick as 0.1 $\mu$m–5 $\mu$m. In addition, the thickness of this anodic oxide layer 9 can be controlled by the time of anodic oxidation.

In this embodiment, a 0.3 $\mu$m–1 $\mu$m thick porous anodic oxide layer 9 was formed by carrying out an anodic oxidation process for 20 min.–30 min. in an oxalic acid solution with a voltage of 4 V. As the mask film 8, photoresist used for the patterning of the gate electrode 7 can be used as it is.

In addition, in the case where 5 nm–50 nm thick aluminum oxide was formed at the surface with a low applied voltage of 5 V–40 V by anodic oxidation process prior to the formation of the mask film 8, the adhesion with the mask film 8 was improved, which proved effective for forming the porous anodic oxide layer 9 only on the side face during the subsequent anodic oxidation process.

Figure 3A:
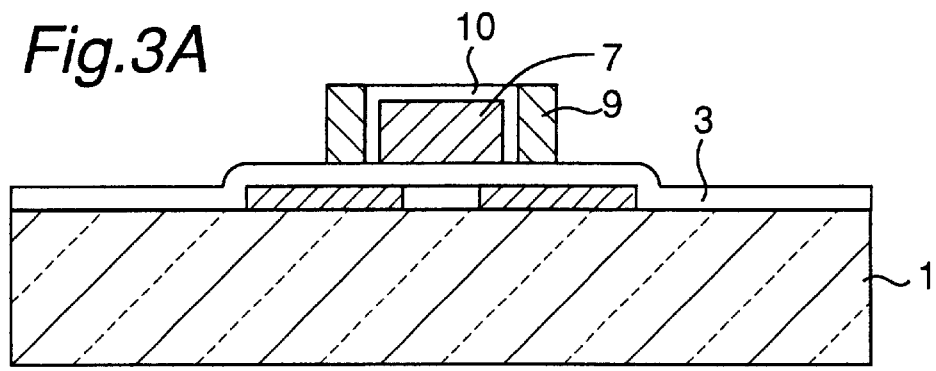
FIGS. 3A and 3B are process views showing a method for fabricating a semiconductor device according to the invention.

Next, as shown in FIG. 3A, with the mask film 8 removed, a current was applied to the gate electrode 7 again in the electrolytic solution. In this embodiment, a 50 V–200 V voltage was applied to the gate electrode 7 in ethylene glycol solution containing a 1%–10% of tartaric acid, boric acid and nitric acid. By this step, a barrier type anodic oxide layer 10 was able to be formed on the side face and top face of the gate electrode 7.

Notwithstanding that this step is a step subsequent to the porous anodic oxidation, the barrier type anodic oxide layer 10 was formed not outside the porous anodic oxide layer 9 but between the gate electrode 7 and the porous anodic oxide layer 9. The thickness of the formed barrier type anodic oxide layer 10 is proportional to applied voltage. In this embodiment, an about 100 nm thick barrier type anodic oxide layer 10 was formed with a voltage of 80 V.

Figure 3B:
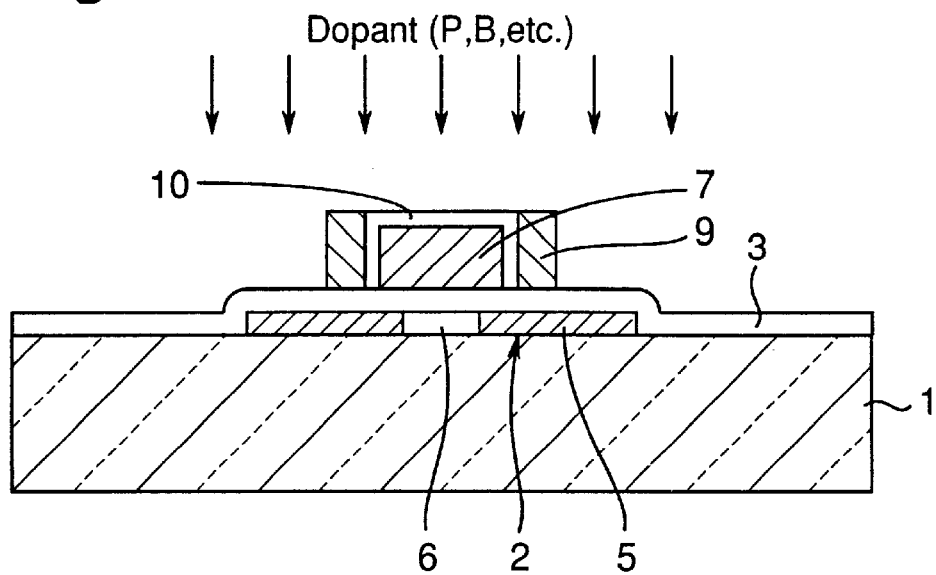

Next, as shown in FIG. 3B, with the gate electrode 7, the porous anodic oxide layer 9 and the barrier type anodic oxide layer 10 used as the mask, the semiconductor layer 2 was doped with dopants at high concentration. More particularly, the semiconductor layer 2 was doped with ions of a dopant such as phosphorus (P) for n-type TFT and boron (B) for p-type TFT by electric field acceleration.

According to the fabrication method of the invention, after the formation of a gate electrode 7, a current is applied to the gate electrode 7 in an electrolytic solution, by which a first anodic oxide layer 9 is formed primarily on the side face of the gate electrode 7, and with the layer 9 and the like used as the mask, a heavily doped region 11 (See FIG. 4A) is formed. Therefore, the boundary position between the lightly doped region 5 and the heavily doped region 11 can be determined in self alignment.

Also, by controlling the thickness of the first anodic oxide layer 9 to be formed on the side face of the gate electrode 7, the length of the lightly doped region 5 can be set arbitrarily. Therefore, the OFF-state current can be suppressed, if desired, by forming the first anodic oxide layer 9 thick, hence the method being a preferred method that allows the characteristics to be optimized easily.

Figure 4A:
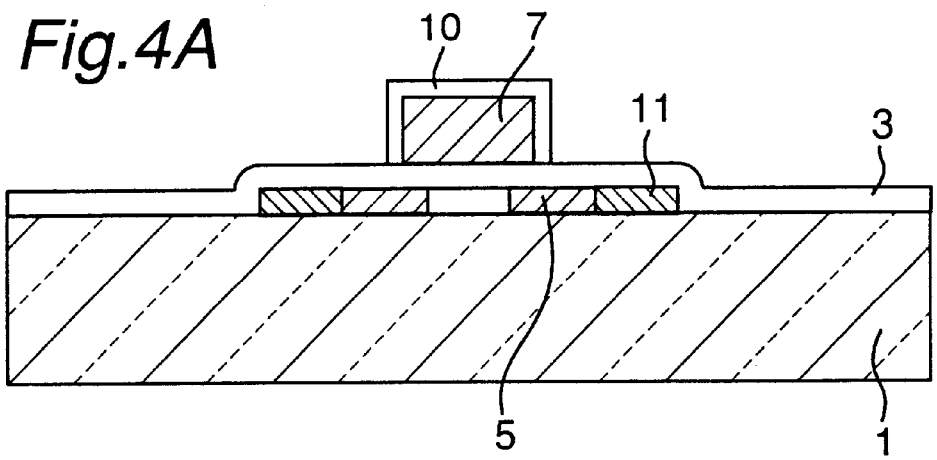
FIGS. 4A and 4B are process views showing a method for fabricating a semicoductor device according to the invention.
Figure 5:
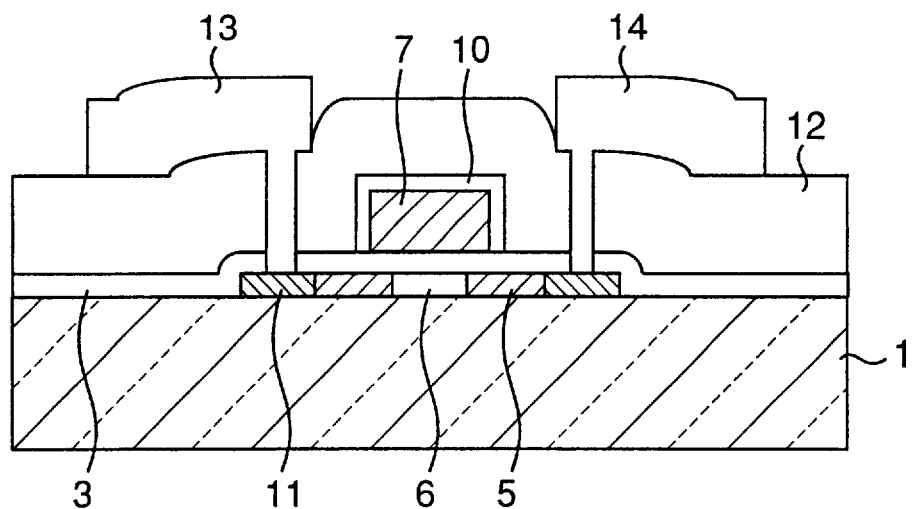
FIG. 5 is a sectional view showing a semiconductor device according to the invention.

Next, as shown in FIG. 4A, the porous anodic oxide layer 9 was removed. As the etchant, phosphorus base solutions such as a mixed acid of phosphoric acid, acetic acid and nitric acid are preferable. This porous anodic oxide layer 9 is selectively etched by the phosphoric acid base etchant. The etching rate of the porous anodic oxide layer 9 by the phosphoric acid base etchant is ten or more times the etching rate of the barrier type anodic oxide layer 10, so that the barrier type anodic oxide layer 10 is substantially not etched by phosphoric acid base etchants. As a result of this, even if the porous anodic oxide layer 9 is etched, the inside gate electrode 7 can be protected.

Thereafter, laser irradiation was performed in order to activate the dopants. As a result, a heavily doped region 11 was formed. This heavily doped region 11 makes source and drain regions, while the portion masked by the porous anodic oxide layer 9 formed in FIG. 2B remains as the lightly doped region 5, making an LDD region.

Figure 4B:
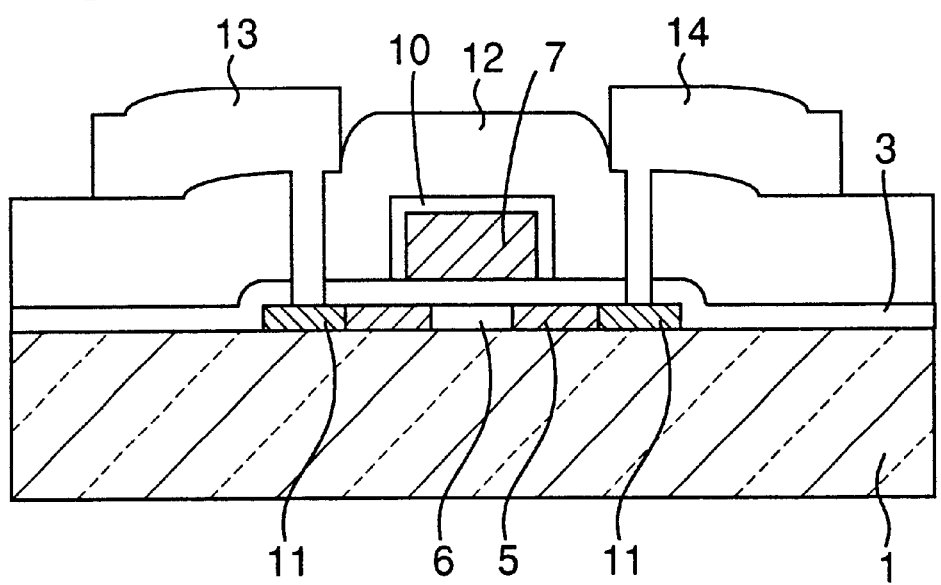

Finally, as shown in FIG. 4B, an interlayer insulator 12 was formed by depositing silicon oxide at a film thickness of, for example, 600 nm by CVD process. Further, contact holes were formed in the gate insulator film 3 and the interlayer insulator 12 on the source/drain region 11, and subsequently aluminum was deposited at a film thickness of, for example, 600 nm by sputtering process and then patterned into a specified configuration, by which a source electrode 13 and a drain electrode 14 were formed. Then, sintering process was performed at 200° C.–500° C. In this way, a polysilicon TFT having a GOLD structure was fabricated, as shown in FIG. 5.

Although not shown in the drawings, for use of the TFT fabricated by the above process in image display apparatus such as liquid crystal displays, after this process, a pixel electrode is formed by connecting a transparent conductive film made of ITO (Indium Tin Oxide) or metal film having a specified configuration to the drain electrode 14.

As described above, according to the fabrication method of the invention, TFTs having a GOLD structure can be fabricated stably with simple process. Also, in the GOLD structured TFT by the fabrication method of the invention, by virtue of the presence of the gate electrode 7 on the LDD region 5, device deteriorations due to negative charges generated in the interface between silicon and oxide on the LDD region or in the oxide in its proximity, as would be seen in conventional LDD structured TFTs, are intercepted by the electrons induced to the LDD region surface by the g ate voltage, thus unlikely to develop.

Figure 6:
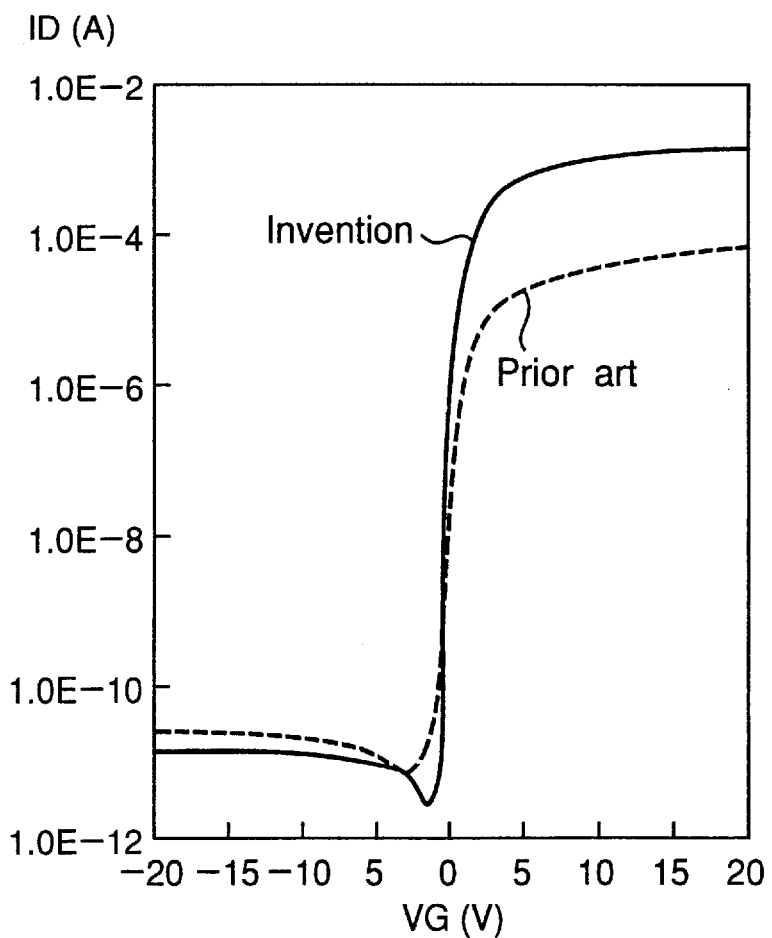
FIG. 6 is a comparative chart showing characteristics of a semiconductor device according to the invention and a semiconductor device according to the prior art.
Figure 7:
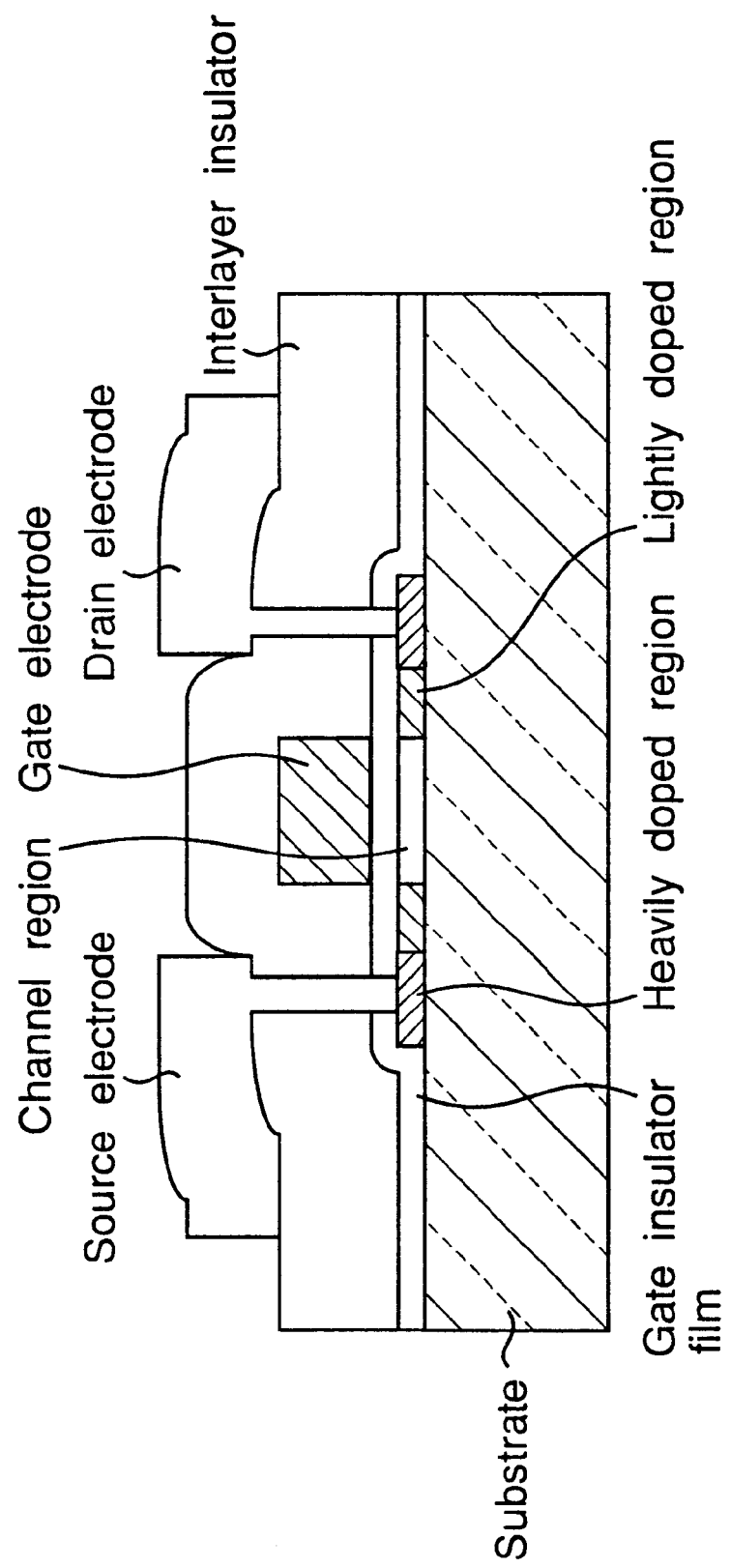
FIG. 7 is a sectional view showing a semiconductor device according to the prior art.

FIG. 6 is a chart of comparison between the GOLD structured TFT of this embodiment and the conventional LDD structured TFT in characteristics after a stress test. According to this FIG. 6, it can be understood that the ON-state current lowered due to characteristic deteriorations in the conventional LDD structured TFT. In contrast, the GOLD structured TFT by the method for fabricating semiconductor devices in this embodiment showed characteristics of sufficient ON-state current, sufficiently low amount of OFF-state current and superior hot carrier resistance.

In addition, although this embodiment has been explained with respect to a TFT to be formed on an insulating substrate such as a glass substrate as an example of semiconductor devices. However, the invention is not limited to this. Therefore, the material, film thickness or deposition process for the conductive material, the insulating films and the like shown in this embodiment may be determined, as required, depending on the specifications of the semiconductor device to be fabricated.

Also, the step for forming the oxide layers on the side face of the gate electrode shown in this embodiment is not limited to anodic oxidation process. For example, the oxide layers may also be formed on the side face of the gate electrode by performing heat treatment in an oxidizing atmosphere. In such a case, however, it is needless to say that appropriate considerations need to be given so that not only the gate electrode, as it is a matter of course, but also sites other than the gate electrode including the substrate are formed of materials resistant to the heat treatment.

Further, the invention can also be applied to, for example, MOS transistors to be formed on a semiconductor substrate other than the TFT shown in the above embodiment, where the same functions and effects as in the TFT can be produced.

As described hereinabove, according to the method for fabricating semiconductor devices of the invention, in fabrication of a semiconductor device having a GOLD structure, on a semiconductor layer having a lightly doped region formed therein, a gate electrode having a length reaching the lightly doped region is formed with the gate insulator film interposed therebetween, and thereafter an anodic oxide layer is formed primarily on each side face of the gate electrode, and further with those anodic oxide layers as the mask, a heavily doped region is formed. Accordingly, it becomes implementable to form the lightly doped region and the heavily doped region in self alignment, and to control the amount of overlap of the gate electrode and the lightly doped region depending on the thickness of the anodic oxide layer. Thus, characteristic optimization of the semiconductor device having a GOLD structure can be easily achieved.

According to the method for fabricating semiconductor devices of the present invention, since a small number of photolithography steps is involved, the amount of positional deviations resulting from alignment in the individual steps can be suppressed to a minimum. Thus, the rate of conforming articles and characteristic uniformity of the resulting semiconductor devices can be stabilized and improved.

Thus, the method for fabricating semiconductor devices of the present invention has made it implementable to successfully achieve both process simplification and finished precision of devices, which have been issues for fabrication of semiconductor devices having a GOLD structure. Hence, the invention can produce large effects on improvement in performance and added values of electronic equipment indispensable for the future information society, in particular, liquid crystal displays or portable equipment with liquid crystal displays mounted thereon.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a semiconductor device having a source region, a drain region, a channel region, a gate insulator film and a gate electrode, the method comprising:

forming a gate insulator film on a surface of a semiconductor;

forming a dopant blocking film of a specified configuration on the gate insulator film;

forming a lightly doped region by doping the semiconductor with dopants at low concentration by using the dopant blocking film as a mask;

forming an electrically conductive material layer on the gate insulator film after removing the dopant blocking film;

forming a gate electrode by processing the conductive material layer into a configuration longer than the dopant blocking film;

forming an oxide layer primarily on each side face of the gate electrode by oxidizing the gate electrode;

forming a heavily doped region by doping the semiconductor with dopants at high concentration by using the gate electrode and the oxide layer as a mask; and removing the oxide layer.

2. The method for fabricating a semiconductor device according to claim 1, wherein the step for forming the oxide layer on the side face of the gate electrode is an anodic oxidation process performed by applying a current to the gate electrode in an electrolytic solution, and the oxide layer is an anodic oxide layer.

3. The method for fabricating a semiconductor device according to claim 1, wherein a boundary position between the gate electrode and the oxide layer is set to an arbitrary position on the lightly doped region.

4. The method for fabricating a semiconductor device according to claim 1, further comprising a step for, after the step of forming an oxide layer on the side face of the gate electrode, forming a barrier type anodic oxide layer between the gate electrode and the oxide layer by anodically oxidizing the gate electrode.

* * * * *